United States Patent [19]

Morita et al.

[11] Patent Number: 4,626,678

[45] Date of Patent: Dec. 2, 1986

[54] LIGHT DETECTING CIRCUIT

[75] Inventors: Tetsuo Morita; Mitsuaki Nishie, both of Kanagawa, Japan

[73] Assignee: Sumitomo Electric Industries, Ltd., Osaka, Japan

[21] Appl. No.: 596,751

[22] Filed: Apr. 4, 1984

[30] Foreign Application Priority Data

Apr. 5, 1983 [JP] Japan .................................. 58-59816

[51] Int. Cl.[4] ........................ H01J 40/14; H03F 17/00
[52] U.S. Cl. .................................... 250/214 A; 330/59
[58] Field of Search ...................... 330/9, 59, 258, 56, 330/308; 250/214 R, 214 A

[56] References Cited
U.S. PATENT DOCUMENTS 3,801,933  4/1974  Teare ............................ 250/214 A Primary Examiner—Gene Wan
Attorney, Agent, or Firm—Sughrue, Mion, Zinn, Macpeak & Seas

[57] ABSTRACT

A light detecting circuit in which noise superposed on a bias voltage of a photodiode is substantially canceled without the aid of a filter circuit employing an inductor. The photodiode is connected between a bias voltage terminal and an inverting terminal of a main amplifier, the latter being implemented with a differential amplifier or a comparator. A capacitance device is connected between the same bias voltage terminal and the other (noninverting) input terminal of the main amplifier. The capacitance device may be either a physical capacitor or a second photodiode which, in either case, should have a capacitance equal to the parasitic capacitance of the first photodiode.

7 Claims, 5 Drawing Figures

PRIO ART

LIGHT DETECTING CIRCUIT

BACKGROUND OF THE INVENTION

The present invention relates to a light detecting circuit which can cancel or suppress a noise component superposed on a bias voltage which might otherwise adversely affect the detected light signal.

FIGS. 1A and 1B shows conventional light detecting circuits. In these figures, reference numeral 1 designates a light detecting photodiode; 2, a differential amplifier; and 3, a noise filter. In order to operate the light detecting photodiode 1, it is necessary to apply a bias voltage $V_b$ thereto; however, when the light detecting photodiode 1 is operated, a noise component having a waveform as shown at the top of FIG. 1A is often superposed on the bias voltage $V_b$. The noise is applied to an input terminal of the differential amplifier 2 through a parasitic capacitor $C_t$, typically about 3 pF, of the photodiode 1 and is amplified together with the received optical signal by the differential amplifier 2.

Such noise adversely affects the detection of the optical signal received by the photodiode 1. For instance, if the noise voltage is 10 mV and the parasitic capacitor $C_t$ of the photodiode is 3 pF, the noise current flowing through the parasitic capacitor $C_t$ is about 1.8 μA. If the optical input has a power level of 1 μW, the corresponding signal current is 0.6 μA. Therefore, it can be understood that the noise current is much larger than the signal current. Accordingly, in the conventional light detecting circuit, it is necessary to apply the bias voltage $V_b$ through the noise filter 3 which is used for a bias circuit, as shown in FIG. 1B. However, the circuit indicated in FIG. 1B is disadvantageous in that it is space consuming, particularly, in that the inductor required thereby cannot be readily fabricated in integrated circuit form.

Accordingly, it is an object of the present invention to provide a light detecting circuit in which a noise component superposed on a bias voltage is eliminated without the use of a filter circuit.

SUMMARY OF THE INVENTION

In accordance with the above and other objects, the invention provides a light detecting circuit including a first photodiode for receiving an optical signal and converting the optical signal into an electrical signal with the first photodiode being coupled to a bias voltage source, a main amplifier receiving the electrical signal on one of two input terminals thereof for amplifying the electrical signal, and capacitance means coupled to the other terminal of the main amplifier and to the bias voltage source for cancelling a noise component mixed in the circuit, due to the parasitic capacitance of the first photodiode, from the bias voltage terminal. The main amplifier may be a differential amplifier or a comparator, and the two input terminals the inverting and noninverting terminals thereof, respectively. The capacitance means may be a capacitor having a capacitance value equal to the parasitic capacitance of the first photodiode, or a second photodiode having a parasitic capacitance equal to that of the first photodiode.

DESCRIPTION OF THE PREFERRED EMBODIMENTS

Preferred embodiments of the invention will be described in detail with reference to FIGS. 2, 3 and 4.

Figure 1A:
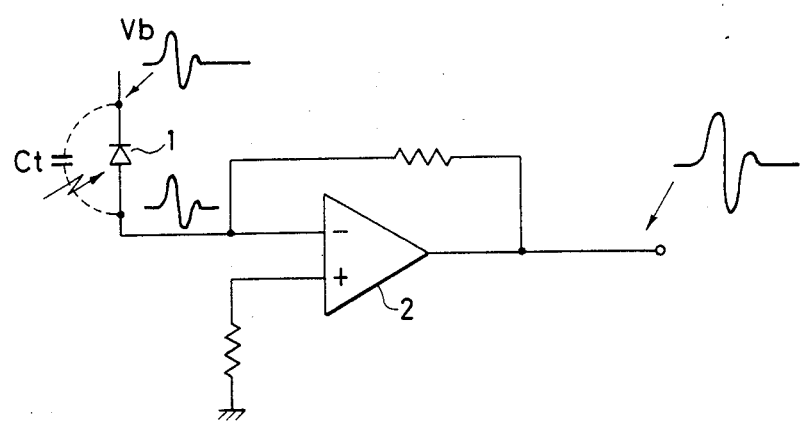
FIGS. 1A and 1B are circuit diagrams showing conventional light detecting circuits.
Figure 1B:
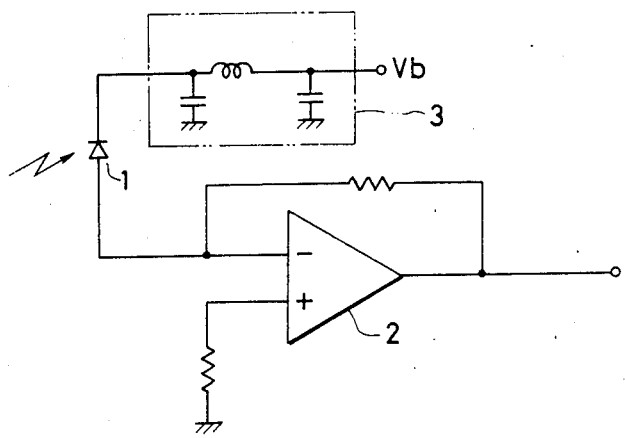
Figure 2:
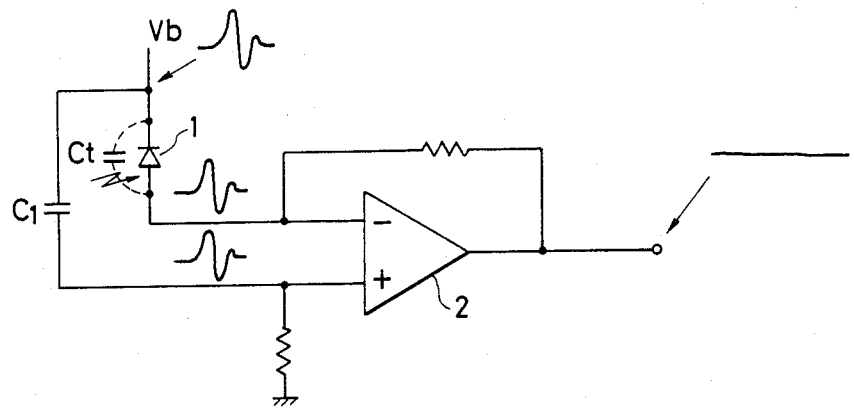
FIGS. 2, 3 and 4 are circuit diagrams of first, second and third examples of a light detecting circuit according to the invention.

FIG. 2 shows a first example of a light detecting circuit constructed according to the invention. In this example, a capacitor $C_1$, which is substantially equal in capacitance value to the parasitic capacitance $C_t$ of the photodiode 1, is connected between the bias voltage $V_b$ terminal and the noninverting input terminal of the differential amplifier 2. Therefore, a noise component mixed in the bias voltage $V_b$ applied through the parasitic capacitance $C_t$ of the photodiode 1 to the inverting input terminal of the differential amplifier 2 is also applied through the capacitor $C_1$ to the noninverting input terminal of the differential amplifier 2. Accordingly, if the common mode rejection ratio (CMMR) of the differential amplifier 2 is ideal and the capacitance value of the capacitor $C_1$ is equal to that $C_t$ of the photodiode, the noise superposed on the bias voltage $V_b$ is not outputted by the differential amplifier 2 since it is completely canceled out. In practice, the common mode rejection ratio of the differential amplifier 2 is of the order of 80 dB in the DC region, but in the high frequency region it is often of the order of 20 dB (at 10 MHz). Therefore, although complete cancellation is not effected in the high frequency region, the noise can be suppressed by 20 dB, that is, to one-tenth of the original level. Thus, a noise current of 1.8 μA as mentioned above can be reduced to 0.18 μA.

As the noise current is greatly decreased according to the invention as described above, the signal detecting sensitivity of the circuit can be markedly increased. That is, in order to successfully detect a signal, the signal voltage must be much larger than the noise voltage, and in the light detecting circuit of the invention the value of the necessary signal voltage can be reduced by an order of magnitude. This means that the signal detecting sensitivity can be increased by an order of magnitude. If it is assumed, for instance, that the load resistance is 50 KΩ, and if the noise current is 1.8 μA as mentioned above, the noise voltage is 90 mV in the conventional light detecting circuit, but it is 9 mV in the light detecting circuit of the invention.

Figure 3:
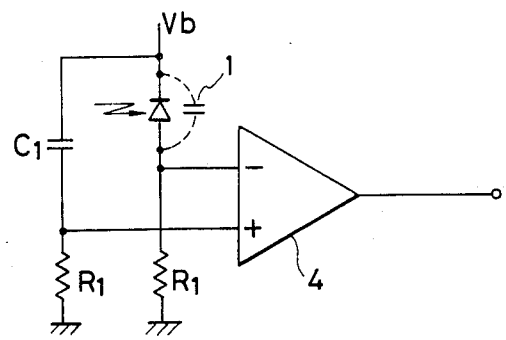

FIG. 3 shows a second example of a light detecting circuit of the invention. In this example, instead of the differential amplifier 2, a comparator 4 is employed as a main amplifier. Equal valued bias resistors $R_1$ are connected between the comparator input terminals and ground. In this example as well, a capacitor $C_1$ is connected to the input terminal of a photodiode 1 to cancel or suppress noise mixed in the bias voltage $V_b$.

Figure 4:
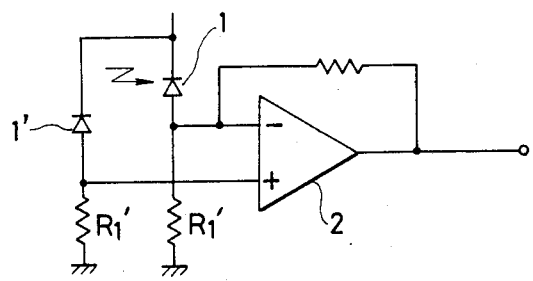

FIG. 4 shows a third example of a light detecting circuit of the invention. In the third example, a dummy photodiode 1' is provided in parallel with the photodiode 1, and the photodiode 1' is arranged so as to not receive an optical signal. Equal valued bias resistors $R_1'$ are connected between the inputs to differential amplifier 2 and ground. If the dummy photodiode 1' has the same characteristics as the photodiode 1, that is, if the parasitic capacitance of the former is equal to that of the latter, noise mixed in the bias voltage $V_b$ can be completely canceled out. The output characteristic of the arrangement of FIG. 4 is preferred over that of the arrangement of FIG. 2 or 3 in which the capacitor $C_1$ is employed. However, the system using the capacitor $C_1$ is advantageous with respect to manufacturing cost and the utilization of space.

We claim

1. A light detecting circuit comprising:
    a first photodiode receiving an optical signal and converting said optical signal into an electrical signal, said first photodiode being coupled to a bias voltage source;
    a main amplifier receiving said electrical signal upon one of two input terminals thereof for amplifying said electrical signal; and
    capacitance means connected to the other input terminal of said main amplifier and to said bias voltage source for canceling noise mixed in said circuit through a parasitic capacitance of said first photodiode from said bias voltage source.

2. The light detecting circuit as claimed in claim 1, in which said main amplifier comprises a differential amplifier.

3. The light detecting circuit as claimed in claim 1, wherein said main amplifier comprises a comparator.

4. The light detecting circuit as claimed in claim 1, wherein said one input terminal and said other input terminal of said main amplifier comprise an inverting input terminal and a noninverting input terminal, respectively.

5. The light detecting circuit as claimed in claim 1, wherein said capacitance means comprises a capacitor having a capacitance value substantially equal to a parasitic capacitance value of said first photodiode.

6. The light detecting circuit as claimed in claim 5, further comprising first and second bias resistors having equal resistance values coupled between said one input terminal and said other input terminal, respectively, and a ground terminal.

7. The light detecting circuit as claimed in claim 1, wherein said capacitance means comprises a second photodiode having a parasitic capacitance substantially equal to a parasitic capacitance of said first photodiode.

* * * * *